United States Patent [19]

Kolomoets et al.

[11] 4,049,469

[45] Sept. 20, 1977

[54] FILM THERMOELEMENT

[76] Inventors: Nikolai Vasilievich Kolomoets, ulitsa Kastanaevskaya 61, kv. 22; Zinovy Moiseevich Dashevsky, ulitsa Marxa-Engelsa 15, kv. 52; Vladimir Isaakovich Granovsky, ulitsa Bazhova 15, korpus 1, kv. 84; Igor Aronovich Shmidt, Leningradsky prospekt 24, kv. 41; David Mendelevich Gelfgat, ulitsa Nagornaya 49, korpus 18, kv. 58, all of Moscow, U.S.S.R.

[21] Appl. No.: 702,618

[22] Filed: July 6, 1976

Related U.S. Application Data

[63] Continuation of Ser. No. 588,780, June 20, 1975, abandoned.

[51] Int. Cl.² ........................................... H01L 35/04
[52] U.S. Cl. ...................................... 136/225; 29/573
[58] Field of Search ........................... 29/573; 36/225

[56] References Cited

U.S. PATENT DOCUMENTS

| 3,088,989 | 5/1963 | Lipkis | 136/225 |
|---|---|---|---|
| 3,400,452 | 9/1968 | Emley | 29/573 |
| 3,930,303 | 1/1976 | Alais et al. | 29/573 |

Primary Examiner—Leland A. Sebastian
Attorney, Agent, or Firm—Holman & Stern

[57] ABSTRACT

A film thermoelement wherein each branch thereof comprises a film of a semiconductor material contacting on one of its sides a hot thermal bus and on the other of its sides a cold thermal bus. The contact between the thermal buses and the film is maintained through separate strips of a heat-conducting material displaced with respect to each other on the opposite sides of the film. The gaps between the contact strips may be filled with an inert gas.

2 Claims, 2 Drawing Figures

FILM THERMOELEMENT

This is a continuation of applicaton Ser. No. 588,780 filed June 20, 1975, now abandoned.

BACKGROUND OF THE INVENTION

The present invention relates to converters of thermal energy into electric energy and, more particularly, to film thermoelements.

There are known film thermoelements comprising two branches formed by films of semiconductor material of the p- and n-types of conductivity, which films are interconnected by means of commutation buses, their end face surfaces being in contact with a hot bus on one side and with a cold bus on the other.

In such thermoelements the heat flux flows along the film branches of the thermoelement having an extremely low $s/1$ ratio, where $s$ is the cross-sectional area of a branch, equal to the product $b \times h$, where $h$ is the thickness of the film of a p- or n-type semiconductor material, $b$ is the width of the film and 1 is the length of the film making up the branch of the thermoelement.

In the existing film thermoelements $1 > b$ and $1 >> h$; as a result, only weak heat fluxes G are passed along the branches, said heat fluxes being proportional to $s/1$. This, in turn, accounts for an extremely low amount of electric power taken from a thermoelement of this type.

The power output of this type of thermoelement may be increased in two ways.

The first way is to increase the cross-sectional area $s$ of the branches of a film thermoelement, for example, by using in each branch a large number of films in parallel connection. This augments the total thickness of the semiconductor films forming the branches of the thermoelement, which, in turn, results in a more powerful heat flux. Solving this problem, however, is a very long and laborious process.

The other way is to arrange the thermal buses on the top and at the bottom of the semiconductor films which form the branches of the thermoelement. In this case the heat flux is perpendicular to the plane of the film, and a temperature drop is produced over a distance $h$ equal to the thickness of the film, which, as has been stated above, is very small. In the case under review the heat flux Q is proportional to the relation $(1 - b)/h$ which is very great. This leads to great thermal losses on the commutation buses since the thermal and electrical resistance of the film is proportional to the relation $h/(1 \times b)$ which is very small and is comparable with the thermal and electrical resistance of the contacts between the semiconductor film and the commutation buses.

SUMMARY OF THE INVENTION

It is an object of the present invention to provide a film thermoelement wherein the branches are designed so that with the passage of a heat flux therethrough the ratio $s/1$ will be close to 1.

It is another object of the present invention to provide a film thermoelement with a greater electric power output.

It is still another object of the present invention to provide a film thermoelement characterized by low thermal and electric losses.

The foregoing objects are attained by providing a film thermoelement wherein each branch comprises a film of a semiconductor material, said film contacting on its one side with a hot thermal bus and on its other side, with a cold thermal bus, the contact between the thermal buses and the film being maintained, in accordance with the invention, through separate contact strips of a heat-conducting material, which strips are displaced in relation to one another on the opposite sides of the film. It is expedient if the gaps between the contact strips are filled with an inert gas.

The advantages of the proposed film thermoelement include substantially reduced, in comparison with known thermoelements, thermal and electric losses.

In each branch of the proposed film thermoelement, with $y > x$ and $y/h > 1$, where $y$ is the spacing between contact strips, $x$ is the width, and $l$ is the thickness of the semiconductor film, the heat and electric fluxes are directed substantially along the film and are perpendicular to the fluxes through the contact strips. The portions of the film between adjoining contact strips at the opposite sides thereof are connected in parallel with the electric and heat flux. The overall number of such parallel-connected portions is equal to the sum total of all the contact strips (the upper and lower ones). Due to the fact that the number of such portions may be very great, the overall heat flux, too, may be great, despite the smallness of each individual flux.

BRIEF DESCRIPTION OF THE DRAWINGS

Other objects and advantages of the present invention will be more fully understood from the following detailed description of preferred embodiments thereof taken in conjunction with the accompanying drawings, wherein.

DESCRIPTION OF THE PREFERRED EMBODIMENTS

Figure 1:
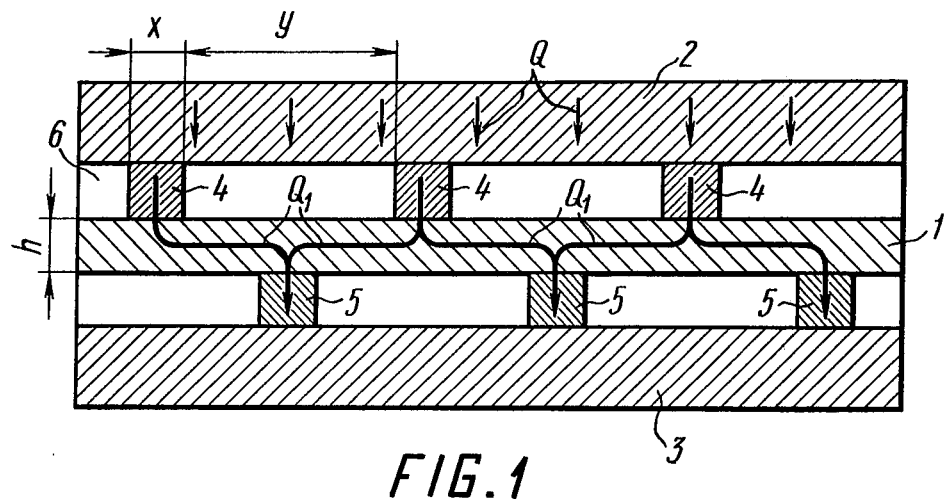
FIG. 1 is a cross-sectional view of a branch of a film thermoelement in accordance with the invention.

Referring now to the attached drawings, a branch of a film thermoelement, whose cross-sectional view is shown in FIG. 1, is a film 1 of a semiconductor material of the n-type of conductivity for an n-branch or p-type of conductivity for a p-branch, which film 1 is in contact on one side with a hot thermal bus 2 and on the other side, with a cold thermal bus 3, the contact being maintained through separate contact strips 4 and 5 displaced with respect to one another on the opposite sides of the film 1. Strips 4 and 5 are made from a material having a high thermal and electric conductivity, for example, silver, copper or aluminum. In FIG. 1, $y$ is the gap between the contact strips 4 and 5, and $x$ is the width of the contact strips 4 and 5. The contact strips 4 and 5 are arranged so that $y$ is greater than $x$, and the ratio $y/h$ is greater than one, where $h$ is the thickness of the film 1.

By connecting in series the n-branch and the p-branch constructed as described above, a thermoelement in accordance with the present invention is obtained.

Heat losses from the surface of the film 1 are considerably reduced if the gaps between the contact strips 4 and 5 are filled with an inert gas, for example, Ar. It is necessary in such a case that plates 6 be mounted on the end face surfaces of the thermoelement.

Figure 2:
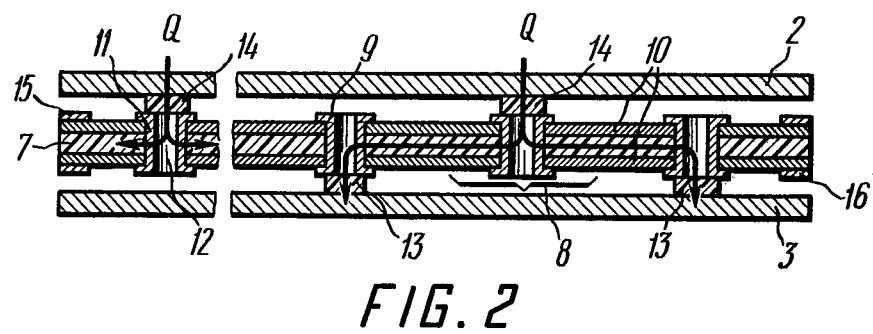
FIG. 2 is a cross-sectional view of a film thermopile assembled from thermoelements of the present invention, with thermal buses connected thereto.

Thermoelements according to the invention may be employed to assemble a thermopile whose cross-sectional view is represented in FIG. 2. The thermopile comprises a substrate 7 with a number of thermoelements 8 applied onto it. The thermoelements 8 are interconnected in series with the aid of commutation buses 9. Each branch of the thermoelement comprises two films 10 of one type of conductivity, which films are applied onto opposite sides of the substrate 7, one opposite the other, and are electrically interconnected by means of a metal layer 11 in holes 12 provided in the substrate 7. The thermopile contacts on one side with the cold thermal bus 3, and on the other side with the hot thermal bus 2 the contact being maintained through separate contact strips 13 and 14 displaced with respect to each other on the opposite sides of the substrate 7, which strips 13 and 14 are made from a dielectric material having a high heat conductivity, for example beryllium or aluminum oxide. The strips 13 and 14 are in contact with each second commutation bus 9 on both sides of the substrate 7. Voltage produced by the thermopile is taken from leads 15 and 16.

The film thermoelement for which each branch is constructed in accordance with FIG. 1 operates as follows. A temperature difference between the thermal buses 2 and 3 causes a heat flux Q (FIG. 1) from the hot bus 2 to the cold bus 3, which heat flux is divided by the contact strips 4. After flowing through each strip 4 the heat flux Q is divided into two elementary fluxes $C_1$. At each portion of the film 1 between the adjoining contact strips 4 and 5 the elementary heat flux $C_1$ is directed along the film 1 and is perpendicular to the direction of the heat flux Q through the contact strips 4 and 5. The portions of the film 1 between the adjoining contact strips 4 and 5 are connected in parallel. This parallel arrangement applies both to the heat and electric fluxes, as all the contact strips 4 and 5 on each side of the film 1 are connected by means of metal plates which are the thermal buses 2 and 3. The total number of the parallel-connected portions is equal to the sum total of all the contact strips 4 and 5 (the upper and the lower ones).

The film thermopile of FIG. 2 operates as follows. A temperature difference between the thermal buses 2 and 3 causes a heat flux Q from the hot bus 2 to the cold bus 3, which flux is divided, in the manner described above, by the contact strips 14 and flows therefrom along the branches of the films 10 of the film thermopile.

All the branches of the thermopile are connected in series so the total electromotive force E of the thermopile is:

$$E = (\alpha_p + /\alpha_n/). m/2 . \Delta T,$$

where $\alpha_p$ is the e.m.f. coefficient of the p-branch; $\alpha_n$ is the e.m.f. coefficient of the n-branch; $m$ is the number of branches in the thermopile; and $\Delta T$ is the temperature difference between the thermal buses 2 and 3. This formula does not take into account the thermal losses on the contact strips 13 and 14 which in this case are insignificant. As the film thermopile is switched to an electric circuit, the voltage is taken from the leads 15 and 16.

What is claimed is:

1. A film thermoelement comprising: branches; a film of a semiconductor material in each said branch; a plurality of contact strips applied onto one side of said film and forming gaps therebetween; another plurality of contact strips applied onto the other side of said film and forming gaps therebetween said another plurality of contact strips being displaced with respect to said first plurality of contact strips; a hot thermal bus in direct contact with said first plurality of contact strips; and a cold thermal bus in direct contact with said other plurality of contact strips.

2. A film thermoelement as claimed in claim 1, wherein said gaps between said contact strips are filled with an inert gas.

* * * * *